US006457355B1

(12) United States Patent  
Philipp

(10) Patent No.: US 6,457,355 B1
(45) Date of Patent: Oct. 1, 2002

(54) LEVEL SENSING

(76) Inventor: Harald Philipp, 7 Cirrus Gardens, Hamble, Southampton, Hants SO31 4RH (GB)

(*) Notice: Subject to any disclaimer, the term of this patent is extended or adjusted under 35 U.S.C. 154(b) by 83 days.

(21) Appl. No.: 09/645,857

(22) Filed: Aug. 24, 2000

(30) Foreign Application Priority Data

Aug. 27, 1999 (GB) .............................. 9920301

(51) Int. Cl.$^7$ .......................... G01F 23/00; G08D 21/00
(52) U.S. Cl. .................................... 73/304 C; 340/620
(58) Field of Search .......................... 73/304 C; 340/620

(56) References Cited

U.S. PATENT DOCUMENTS

| 2,868,015 A | * | 1/1959 | Haropulos ................. 73/304 C |
| 4,237,878 A | | 12/1980 | Kobayashi et al. |
| 4,947,689 A | * | 8/1990 | Hochstein ................. 73/304 C |
| 5,043,707 A | | 8/1991 | Heinze |
| 5,135,485 A | | 8/1992 | Cohen et al. |
| 5,142,909 A | * | 9/1992 | Baughman ................. 73/304 C |
| RE34,731 E | | 9/1994 | Lee et al. |
| 5,613,399 A | | 3/1997 | Hannan et al. |
| 5,730,165 A | | 3/1998 | Philipp |
| 5,747,689 A | | 5/1998 | Hampo et al. |

* cited by examiner

Primary Examiner—Hezron Williams
Assistant Examiner—Katina Wilson
(74) Attorney, Agent, or Firm—David Kiewit

(57) ABSTRACT

A capacitance measurement circuit 1 has a pair of level indicating LEDs 2,3. Via one input 4, the circuit is connected to the metallic wall W of a container C of water. This connection can be direct or, as indicated by broken lines, via earth. Via a second input 5, the circuit is connected to a probe 6. This has a stem 7 with a transversely arranged disc 8 at its lower end. Spaced above the lower end, a second, larger, transverse disc 9 is secured to the stem. The stem and the discs are of conductive metal, typically copper, and electrically connected and common. The entire probe is insulated, except for its point of contact with the input 5.

When the liquid is just below the level of the lower disc 8, the capacitance between it and earth, the liquid being conductive, will be determined by the area of the disc, its separation from the liquid and the dielectric constant of the intervening gap. The capacitance varies in proportion to the gap. Hence when the liquid is well below the disc the capacitance will be small. As soon as the liquid covers the disc, the capacitance will reach a maximum—for this disc. The maximum will be dictated by the thickness of the insulation material separating the disc as such from the liquid and the fact that the area is in effect doubled by the liquid covering both surfaces.

15 Claims, 4 Drawing Sheets

LEVEL SENSING

The present invention relates to level sensing with a capacitive sensor.

Capacitive proximity switches are known. They can be used for level sensing.

As water approaches a metallic probe, the capacitance between the probe and the water changes. In particular if the probe is arranged parallel to the free surface of the water, as the water rises, there will be a steep rise in the capacitance as the free surface makes its final approach to the probe.

The capacitance will not increase on any further rise in the water above the probe. For detecting a further rise, duplication of the probe and associated detection circuitry is required.

The object of the present invention is to adapt capacitive level sensing to detect two levels in an improved manner.

According to one aspect of the invention there is provided a level sensor for sensing the level of a flowable material, the sensor comprising:
  means for measuring capacitance;
  a pair of electrodes, being:
    a return electrode and
    a measuring probe, arrangeable to exhibit a capacitance—measurable by the measuring means—between itself and the return electrode, the capacitance varying in use with flowable material level,
  wherein the measuring probe has:
    two, electrically-common, level-detecting formations, each being arrangeable at least substantially parallel with a free surface of the flowable material, whereby two steep rises in the capacitance are measurable as the flowable material rises past first one of the formations and then the other formation and wherein the measuring means is adapted to indicate flowable material level in accordance with the presence/absence of the flowable material at the two probe formations.

Normally the "flowable material" will liquid, but it should be noted that the level sensor may find application in sensing the level of other flowable materials, which are not liquids in the strict scientific sense as in the distinction between solids, liquids and gases. Sensors for such applications are included within the scope of the present invention.

Normally, the return electrode will be a discrete probe arrangeable in or adjacent the liquid. However, it can be envisaged that the return electrode is in effect earth, the measuring circuit then measuring capacitance to earth.

The two formations may be discrete probe elements which are electrically connected together. These may be configured as strips external to non-metallic vessels. For non-conductive liquids, internal probes, with coaxial outer return electrodes, can be utilized.

Alternatively the two formations may be formed or joined together on a single probe stem. Normally, in order to enable the measuring means to detect the liquid reaching the second formation with more certainty, the latter will have a larger capacitive surface area, typically at least three times that of the first formation. These formations may be of spirally formed wire, the spirals extending transversely of the stem.

For probes used internally of vessels, in particular for conductive liquids, the probes are preferably insulated.

Although the sensor will normally have only two formations, it is envisaged that it may have more formations, with the measuring means being adapted to indicate in accordance with a corresponding plurality of levels.

According to another aspect of the invention there is provided capacitance a measuring means for the level sensor of first aspect of the invention, the capacitance measuring means comprising:
  means for measuring the capacitance between the pair of electrodes;
  means for outputting a first signal if the capacitance is within a certain tolerance of a first threshold and for outputting a second signal if the capacitance is within a certain tolerance of a second threshold.

Normally the capacitance measuring means will be configured as a microchip.

To help understanding of the invention, a specific embodiment thereof will now be described by way of example with reference to the accompanying drawings, in which.

Figure 1:
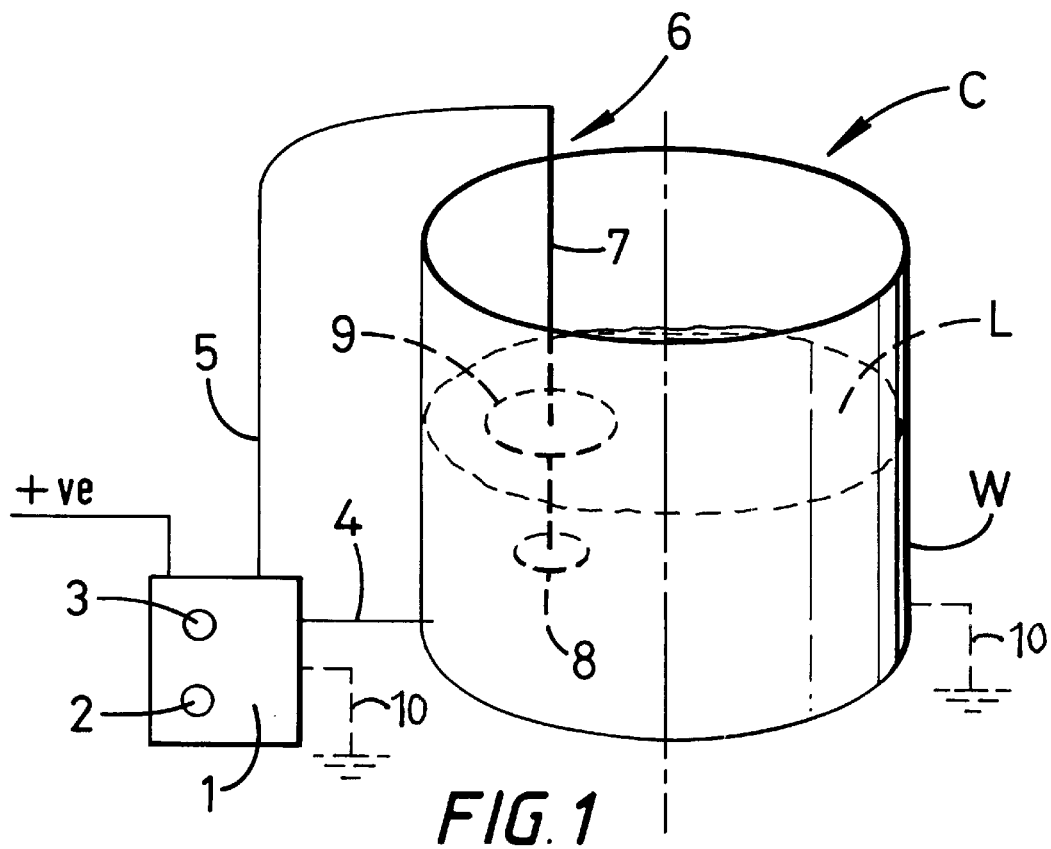
FIG. 1 is a diagrammatic perspective view of a level detector of the invention.

Referring first to FIG. 1, there is shown a capacitance measurement circuit 1 having a pair of level indicating LEDs 2,3. Via one input 4, the circuit is connected to the metallic wall W of a container C of conductive liquid L—typically water. This connection can be direct or, as indicated by broken lines 10, via earth. Via a second input 5, the circuit is connected to a probe 6. This has a stem 7 with a transversely arranged disc 8 at its lower end. Spaced above the lower end, a second, larger, transverse disc 9 is secured to the stem. The stem and the discs are of conductive metal, typically copper, and electrically connected and common. The entire probe is insulated, except for its point of contact with the input 5.

When the liquid is just below the level of the lower disc 8, the capacitance between it and earth, the liquid being conductive, will be determined by the area of the disc, its separation from the liquid and the dielectric constant of the intervening gap. The capacitance varies in proportion to the gap. Hence when the liquid is well below the disc the capacitance will be small. As soon as the liquid covers the disc, the capacitance will reach a maximum—for this disc. The maximum will be dictated by the thickness of the insulation material separating the disc as such from the liquid and the fact that the area is in effect doubled by the liquid covering both surfaces.

Increase in the depth of the liquid over the lower disc will negligibly affect the capacitance until it approaches the upper disc. This has an appreciably greater surface area than the lower disc, typically at least three times, whereby when the liquid covers it, its effect on the capacitance predominates.

The circuit is set up to detect a threshold represented by the capacitance corresponding to the liquid reaching the lower disc and to give an output to light the lower LED 2, thus indicating that the liquid is at the level of the lower disc. Further, it set to detect as a second threshold when the capacitance corresponds to the liquid reaching the upper disc, and hence to light the upper LED 2 in indication of the liquid being at the upper disc.

Figure 2:
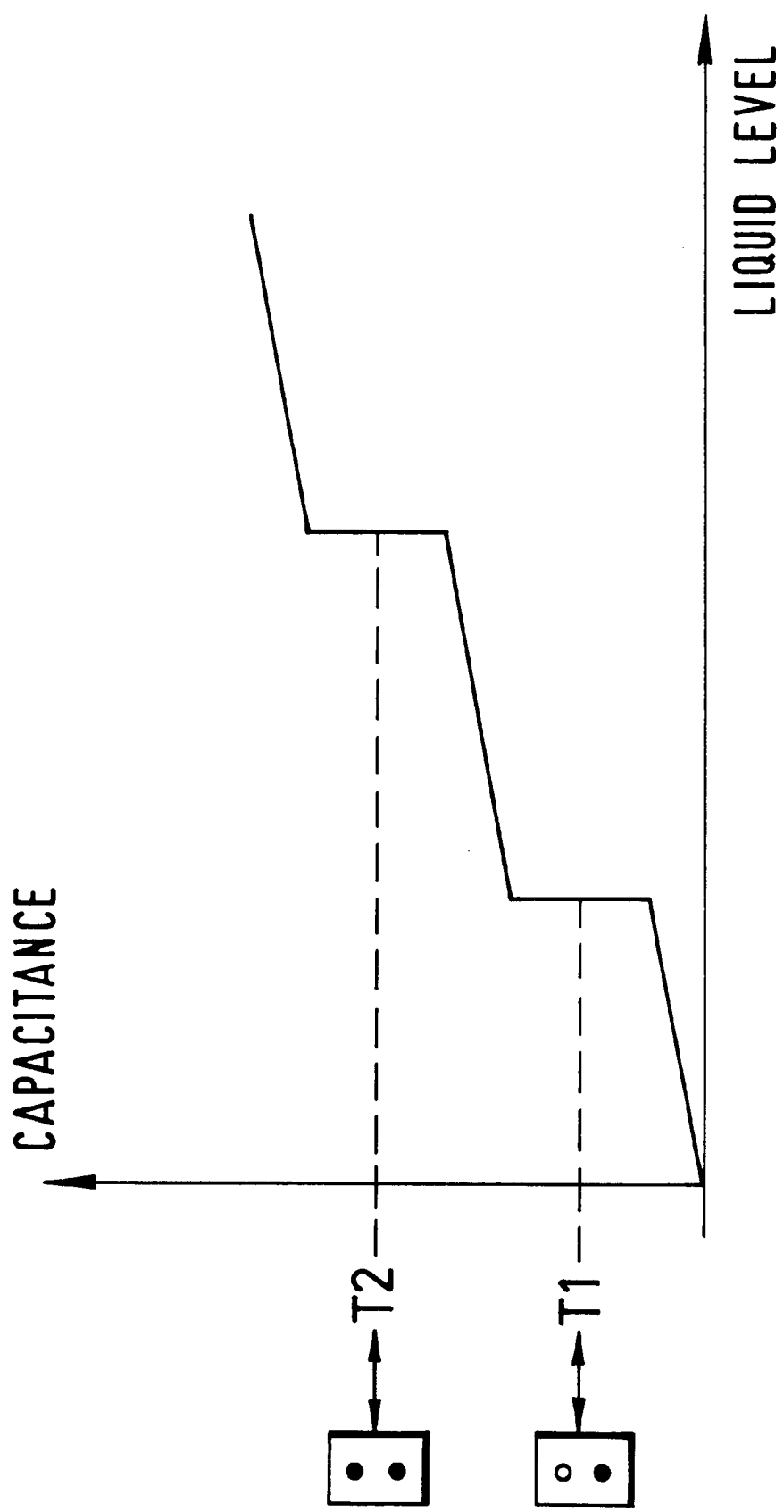
FIG. 2 is a plot of capacitance against liquid depth.

FIG. 2 shows increase of capacitance past the thresholds T1, T2, as the liquid reaches the discs 8,9.

Figure 3:
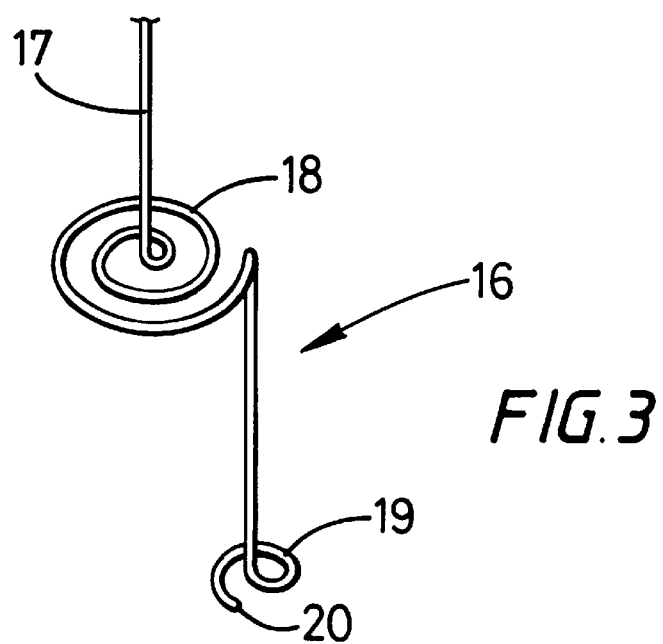
FIG. 3 is a similar view of an alternative probe for the level detector.

Turning now to FIG. 3, the probe 16 thereshown is essentially similar to that of FIG. 1, except being formed from a single length of wire. The stem 17 is continued into the "discs" 18,19, which are in the form of spiral windings. As with the probe 6, the wire of probe 16 is completely insulated—including at its end 20 in the lower disc 19.

Figure 4:
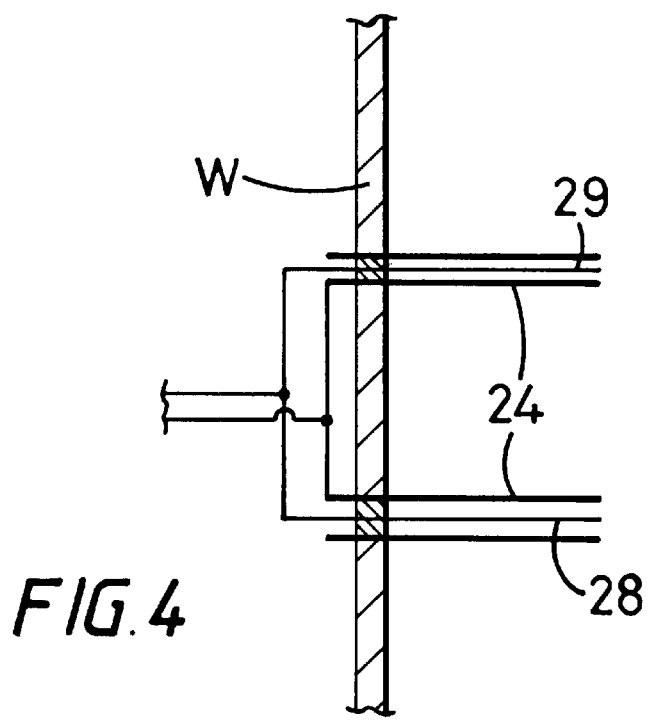
FIG. 4 is a side view of another pair of probes.
Figure 5:
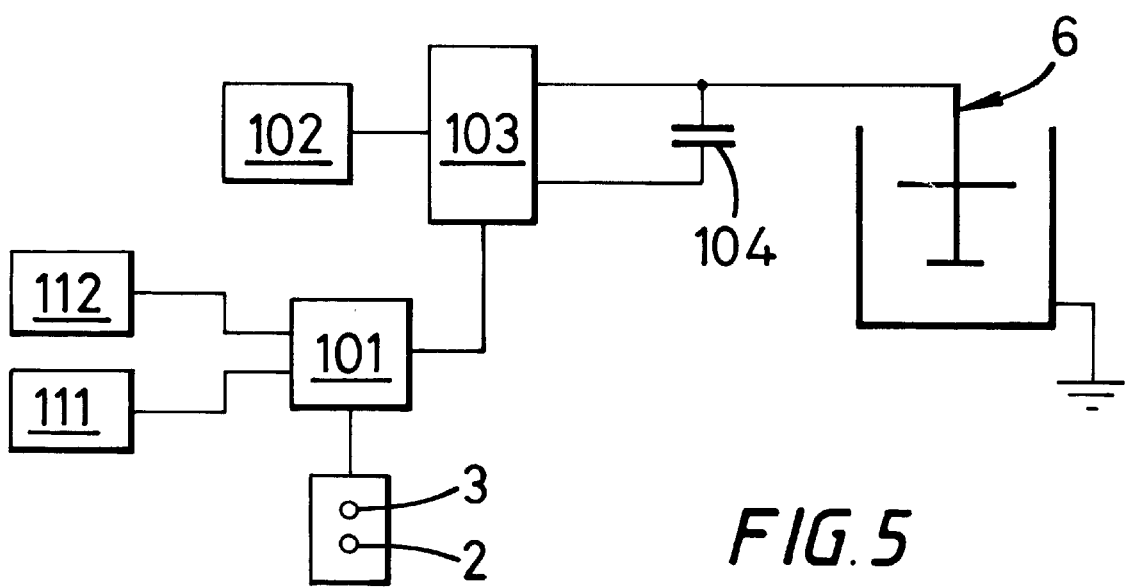
FIG. 5 is a block diagram of the counter of the level detector of FIG. 1

The arrangement of FIG. 4 is for use with non-conductive liquids, where the capacitance is between the probes and the return electrodes as opposed—in the cases of FIGS. 1 & 2—between the probes and the closest portion of the conductive water. The probes 28, 29 are central wires arranged at appropriate heights and surrounded by coaxial outer tubes 24, which may be perforate. Liquid rising in the vessel, into whose wall W the probes have been fitted, can flow into the space between the probe concerned and its outer tube. In so doing, it changes the dielectric constant of the intervening material, i.e., from that of air to that of the liquid, and hence the capacitance of the probe. The two probes are electrically connected together as are the outer tubes. The lower outer tube is of larger diameter than the upper one to give it a lower capacitance for a common dielectric constant.

The measuring circuit 1 can comprise a microprocessor 101, a burst generator 102, a voltage detecting counter 103 and a sample capacitor 104. In use, the burst generator creates periodically a number of pulses, which the counter passes to the capacitor 104, the latter being connected in parallel with the probe capacitance. Once the voltage across the capacitor reaches a pre-set value, the counter stops and passes its count to the microprocessor. The count is a measure of the capacitance. This charging is repeated periodically and an average value of the capacitance is compared with two thresholds, corresponding to the liquid reaching half way up the first disc or probe and half way up the second disc or probe. If the first threshold is reached, the first LED 2 is illuminated under control of the microprocessor. If the second threshold is reached, the second LED 3 is illuminated. A similar circuit is described in my U.S. Pat. No. 5,730,165, entitled "Time Domain Capacitive Field Detector". However, it should be noted that my earlier circuit is adapted to detect one threshold only.

Where the liquid is liable to sloshing, the measurements of capacitance will vary widely with time. For filtering this, the measuring circuit is provided with two counters 111,112. For each charging cycle, if neither threshold is reached; each counter is decremented by one digit. If just the first threshold is reached, the counter is 111 is incremented by one and the second counter 112 is decremented. If both thresholds are reached, both counters are incremented. As the measurement process progresses, with the liquid sloshing around the probes, more threshold measurements will be reached than if the liquid above the probe were static. Thus, the relevant counter will be incremented more than decremented, and the counter will tend to zero or a limit value. Once the limit value is reached, the relevant LED is switched ON. It stays ON until the counter decrements to zero. This occurs if the liquid level falls below the probe, when the average signal will be below the threshold.

Figure 6:
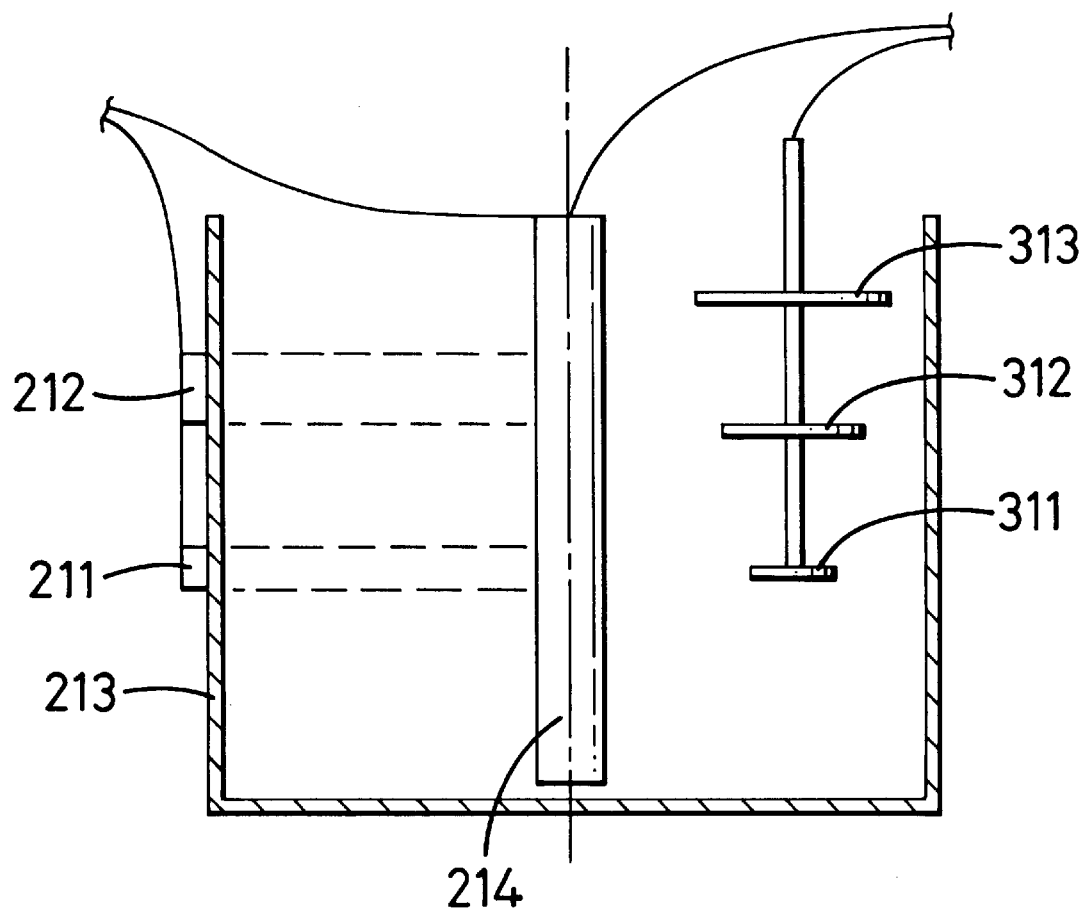
FIG. 6 shows in cross-section two further alternative level detector probes, in opposite halves of the drawing.

Referring to FIG. 6, there is shown in the left half of the Figure an arrangement of a pair of strap like probes 211,212 around an insulating container 213, in which a center return probe 214 is arranged. The outer probes 211,212 are electrically common and the upper one is appreciably wider than the lower. The capacitance between the common outer probes and the inner probe rises when liquid in the container reaches the lower probe, either with the gap between the central probe and the outer probes being filled with increased dielectric constant material or with conductive material causing the "other" plate to be at the inside wall and rising with the material. As in the other variants, as the material reaches the individual order probes there is a step in the measured capacitance.

In the right half of FIG. 6, a probe very similar to that of FIG. 1 is shown. However, it has three discs 311, 312, 313 on the measuring probe. It is used in a manner exactly analogous to FIG. 1, to measure three levels of contents of the container.

The invention is not intended to be restricted to the details of the above described embodiment. In particular, measuring circuit may devices other than LEDs, in particular relays for switching other circuits. Further in the embodiment of FIG. 4, instead of the lower probe being surrounded with a larger diameter tube, their capacitance can be reduced by shortening their length compared with that of the upper probe.

What is claimed is:

1. A level sensor for sensing the level of a flowable material, the sensor comprising:
   a single circuit for measuring capacitance;
   exactly two electrodes, comprising a return electrode and a measuring probe,
   wherein the measuring probe comprises:
      at least two, electrically-common, level-detecting formations, each of the formations arranged substantially parallel to a free surface of the flowable material, whereby two step rises in the capacitance are measurable by the circuit as the flowable material rises past first one of the formations and then the other of the formations.

2. A level sensor as claimed in claim 1, wherein the flowable material is a liquid.

3. The level sensor of claim 1, wherein the return electrode is a discrete probe adjacent the flowable material.

4. The level sensor of claim 1, wherein the return electrode is earth, and the circuit for measuring capacitance comprises a circuit for measuring capacitance to earth.

5. A level sensor as claimed in claim 1, wherein the two formations are discrete probe elements which are electrically connected together.

6. A level sensor as claimed in claim 5, wherein discrete probe elements are configured as strips external to a non-metallic vessel.

7. The level sensor of claim 3, wherein the formations are disposed in the flowable material, the formations being coaxial.

8. A level sensor as claimed in claim 1, wherein the two formations are formed or joined together on a single probe stem.

9. The level sensor of claim 8, wherein the second formation is disposed above the first formation and the second formation has a capacitive surface area at least three times that of the first formation.

10. A level sensor as claimed in claim 8, wherein the formations are of wire formed into spirals extending transversely of a stem.

11. A level sensor as claimed in claim 1, wherein the probes are insulated.

12. A level sensor as claimed in claim 1, wherein the measuring probe has three or more formations, with the measuring means being adapted to indicate in accordance with a corresponding plurality of levels.

13. The level sensor of claim 1, wherein the circuit for measuring capacitance comprises:
   means for measuring the capacitance between the pair of electrodes; and
   means for outputting a first signal if the capacitance is within a certain tolerance of a first threshold and for outputting a second signal if the capacitance is within a certain tolerance of a second threshold.

14. The level sensor of claim 13 further comprising:
   two counters and means for controlling the counters so that
   if neither threshold is reached; each counter is decremented;
   if just the first threshold is reached, the first counter is is incremented and the second counter is decremented; and
   if both thresholds are reached both counters are incremented.

15. The level sensor of claim 13 wherein the circuit for measuring capacitance is configured as a microchip.

* * * * *